United States Patent [19]

Eguchi et al.

[11] Patent Number: 4,951,388
[45] Date of Patent: Aug. 28, 1990

[54] METHOD OF MOUNTING ELECTRONIC COMPONENTS

[75] Inventors: Takao Eguchi, Nishinomiya; Masaru Nagaike, Hirakata; Motoshi Shitanda; Hiroshi Sawada, both of Suita, all of Japan

[73] Assignee: Matsushita Electric Industrial Co., Ltd., Osaka, Japan

[21] Appl. No.: 368,742

[22] Filed: Jun. 20, 1989

[30] Foreign Application Priority Data

Jun. 21, 1988 [JP] Japan .................. 63-153195

[51] Int. Cl.$^5$ .......................... H05K 3/30; B32P 19/00
[52] U.S. Cl. ........................................ 29/832; 29/739; 29/740; 29/741; 29/743; 29/759; 156/497; 156/538; 156/578
[58] Field of Search ................. 29/739, 740, 741, 743, 29/759, 832–836; 156/497, 538, 578

[56] References Cited

U.S. PATENT DOCUMENTS 4,653,664  3/1987  Hineno et al. ..................... 29/740
4,763,405  8/1988  Morita et al. ..................... 29/740

FOREIGN PATENT DOCUMENTS 56-66095  6/1981  Japan .
58-53887  3/1983  Japan .

*Primary Examiner*—P. W. Echols
*Attorney, Agent, or Firm*—Panitch Schwarze Jacobs & Nadel

[57] ABSTRACT

A method of mounting electronic components, comprising steps of: sucking an electronic component by a suction nozzle provided at the tip of a mounting head; holding the sucked electronic component in position by a centering device having an opening and closing mechanism and provided separately from the mounting head, and while holding the component applying adhesive to a side of the electronic component, the side being opposite to that sucked onto the suction nozzle; and mounting the electronic component to a designated position on a printed circuit board. The nozzles on the head are of different sizes.

7 Claims, 3 Drawing Sheets

METHOD OF MOUNTING ELECTRONIC COMPONENTS

BACKGROUND OF THE INVENTION

1. Field of the invention:

This invention relates to a method of mounting electronic components with or without leads to designated positions on a printed circuit board.

2. Description of the prior art:

According to a conventional method wherein electronic components with or without leads are glued to a printed circuit board to form an electronic circuit, adhesive is first deposited to designated positions on the printed circuit board, and thereafter, the electronic components are glued to the electrodes on the printed circuit board using a components-feeding device, the printed circuit board thus produced then being delivered to the drying and soldering steps.

However, in order to deposit adhesive to designated positions on a printed circuit board, either of the following methods must be selected: a depositing tool such as a dispenser is arranged in parallel with a components-feeding head, and two printed circuit boards are separately fixed in position on two stations, respectively, of a board feeding device, before performing the adhesive-depositing and components-mounting steps; or different pieces of equipment are used to perform the respective steps separately. In either method, there is a limit to increasing the speed of mounting components as long as the deposition of adhesive and the feeding of components are performed using two stations.

Japanese Laid-Open Patent Publication Nos. 56-66095 and 58-53887 disclose systems incorporating an adhesive depositing step into a components-feeding station. The former uses a method in which adhesive is applied to an electronic component held in a magazine, the magazine with the component held therein then being mounted on a head to feed the component. This system, however, requires an independent mechanism for depositing adhesive to the electronic component, and is complex in construction, therefore, it has difficulty in increasing the speed of mounting components.

On the other hand, as shown in FIG. 4, the latter system employs a rotary head having a nozzle 1 on a rotating periphery thereof, with a chuck 4 for holding a sucked electronic component 3 provided in a sleeve 2 surrounding the nozzle. As shown in FIG. 3, this system interposes two steps, i.e., a component position-correcting step C (centering) and an adhesive-depositing step D, between the step A of sucking an electronic component from an electronic components-delivery section and the step B of mounting the component.

When the adhesive-depositing step (D) is incorporated in the process between the component-sucking step (A) and the component-mounting step (B), it is necessary in practice for the chuck to hold the component to fix it in position before adhesive is being deposited thereto. With this system, since the component is held in position from two directions by the chuck 4 provided in the sleeve of the nozzle, misalignment of the component sucked onto the tip of the nozzle with respect to a dispenser for depositing adhesive may be prevented when adhesive is deposited to the underside of the component.

However, the above construction involves the following two problems in connection with the recent trend toward the speed-up of the mounting of electronic components of multiple kinds.

First, if the rotary head is operated at high speed, residual vibration remains on the tip of the nozzle when the head temporarily stops during its intermittent rotating motion, with a resultant relative vibration in the adhesive-depositing step, causing misalignment of the position of the dispenser for depositing adhesive with respect to the component held between the tip of the nozzle and the claws of the chuck, thereby causing adhesive to be applied to the chuck claws. Adherence of foreign matter to the chuck claws will lead to misfeeding of components, thus subtantially deteriorating the mounting reliability in practical use.

Secondly, for mounting components of various kinds and different sizes ranging from microchips to ICs, a plurality of nozzles of different sizes which can be selected should be provided in one station. Thus, when using a rotary head, a plurality of nozzles of such different sizes should be attached to the head, and accordingly chucks corresponding to the respective nozzles should be mounted around the nozzles. In practice, however, it is difficult to attach chucks to such a plurality of nozzles of different sizes mounted on the single head.

SUMMARY OF THE INVENTION

The method of mounting electronic components of this invention, which overcomes the above-discussed and numerous other disadvantages and deficiencies of the prior art, comprises steps of: sucking an electronic component by a suction nozzle provided at the tip of a mounting head; holding the sucked electronic component in position by a centering device having an opening and closing mechanism and provided separately from the mounting head, while applying adhesive to a side of the electronic component, the size being opposite to that sucked onto the suction nozzle; and mounting the electronic component to a designated position on a printed circuit board.

In a preferred embodiments, the suction nozzle is brought close to the printed circuit board to mount the electronic component to a designated position on the printed circuit board.

In a preferred embodiment, a dispenser is brought close to the underside of the electronic component chucked in the centering device to apply adhesive to the electronic component.

In a more preferred embodiment, the position of the dispenser for applying adhesive is changed according to the size of each electronic component.

In a preferred embodiment, the mounting head is provided with a plurality of suction nozzles of different sizes.

In a preferred embodiment, the centering claws of the centering device are opened to release the electronic component after application of adhesive to the electronic component.

The method of mounting electronic components comprises steps of: sucking an electronic component by one of a plurality of suction nozzles of different sizes provided at the tip of a mounting head; holding the sucked electronic component in position by a centering device having an opening and closing mechanism and provided separately from the mounting head, while applying adhesive to the underside of the electronic component by bringing a dispenser close thereto, the underside being opposite to the side sucked onto the suction nozzle; releasing the electronic component from the centering device; and mounting the electronic component to a designated position on a printed circuit board.

Thus, the invention described herein makes possible the objectives of (1) providing a method of mounting electronic components at high speed which comprises, between a step of sucking an electronic component onto a nozzle and a step of mounting it on a printed circuit board, a step of applying adhesive to the component by the use of a dispenser while holding the component in position by the use of a centering device, thereby preventing misalignment of the component and the dispenser, all of said steps being carried out on a single station; and (2) providing a method of mounting electronic components which allows various kinds of electronic components to be mounted on the printed circuit board with use of a component-mounting apparatus in which the centering device for holding the component in position during the adhesive-applying step is provided separately from a mounting head having nozzles of different sizes which can be selected in accordance with the size of each component.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 2:
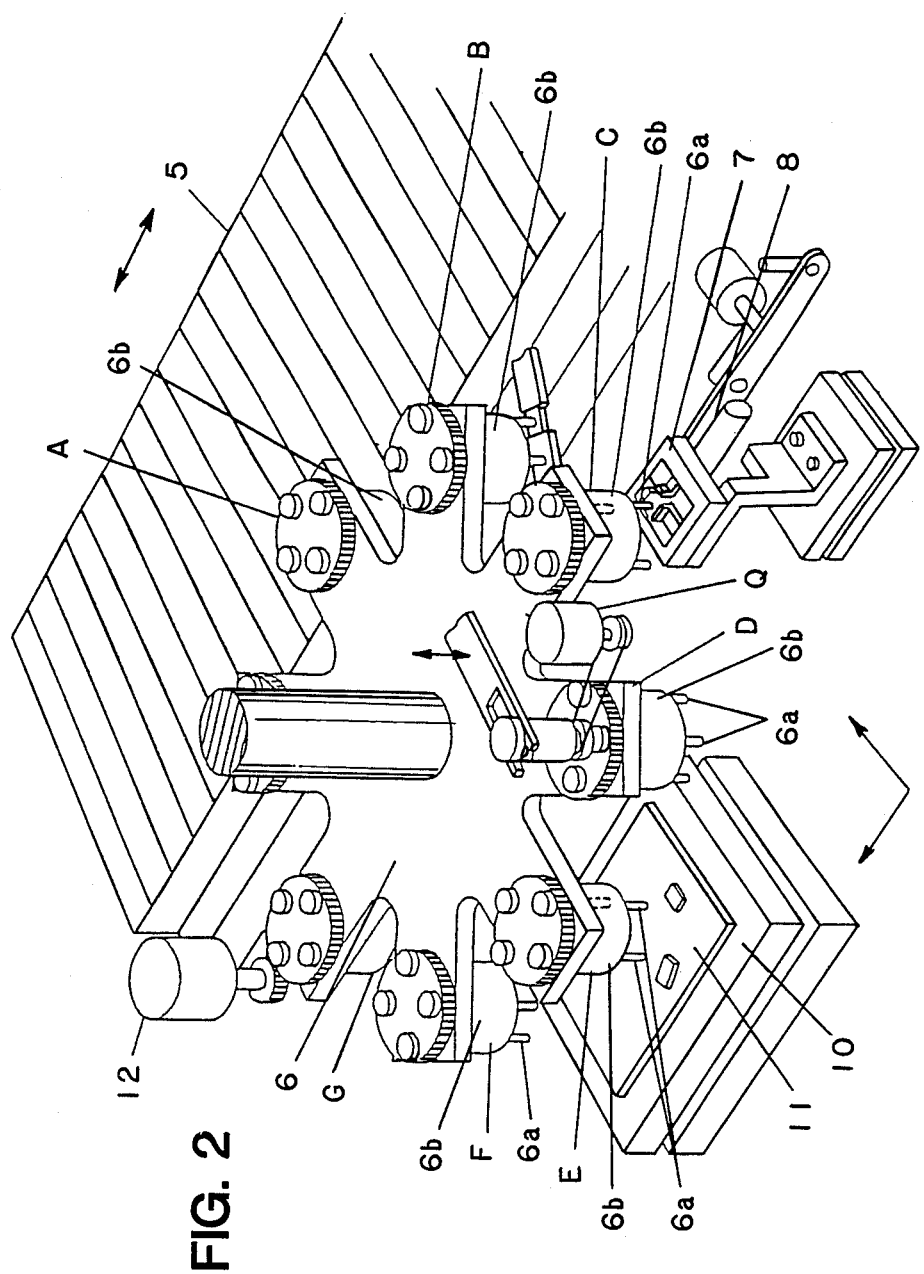
FIG. 2 is a perspective view of a component-mounting apparatus using a method of this invention.
Figure 3:
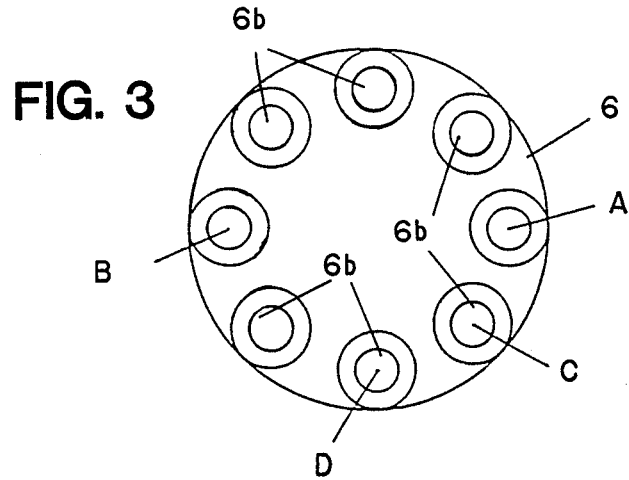
FIG. 3 is a schematic plan view of a conventional rotary head.
Figure 4:
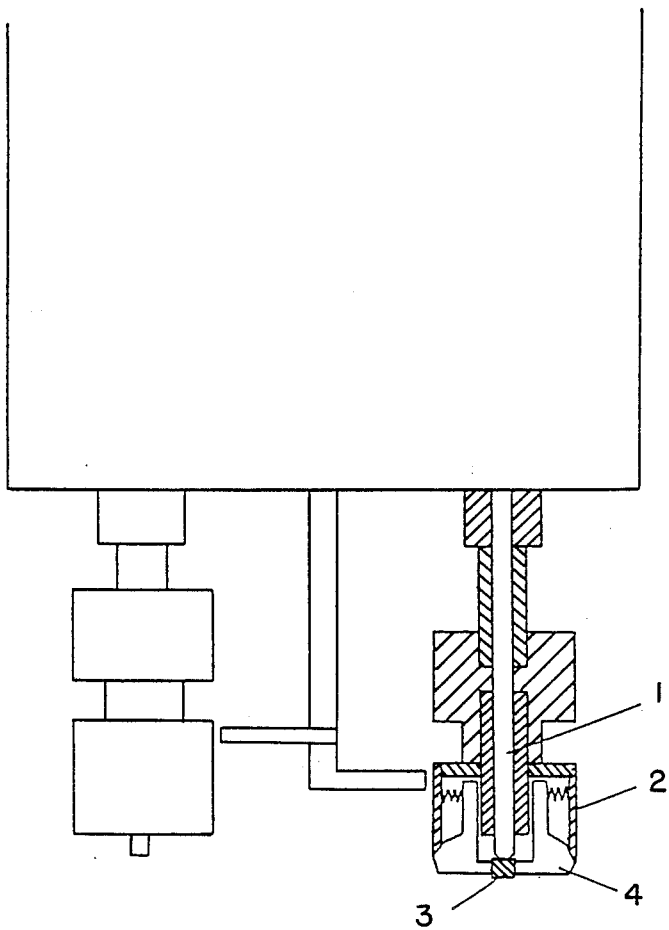
FIG. 4 is a schematic side elevation partly in section of the conventional rotary head of FIG. 3.

FIG. 2 is a perspective view of a component-mounting apparatus using a method of this invention, which functions as a single station for the whole process of mounting electronic components. The reference numeral 5 indicates a component-delivery section, and 6 a rotary head. On the rotating periphery of the rotary head 6 are provided eight sleeves 6b each having four nozzles 6a of different sizes. The rotary head 6 intermittently rotates clockwise so that each of the sleeves 6b stays at stop-positions A, B, C, D, E, F, and G sequentially for a predetermined period, where each step in the process of mounting an electronic component is carried out as follows: the electronic component is sucked by the nozzle at the stop-position A, the presence or absence of a component is detected at the stop-position B, the component is centered while adhesive is applied thereto at the stop-position C, the nozzle is rotated together with the component by a proper angle at the stop-position D, the component is mounted on a printed circuit board at the stop-position E, the component is released and the nozzle is rotated back to its original position at the stop-position F, and an appropriate nozzle is selected at the stop-position G. The reference numeral 7 indicates a centering device, 8 a dispenser, 9 a pulse motor for $\theta$ rotation, 10 a board feeding device, 11 a printed circuit board, and 12 a pulse motor for selecting the nozzle.

Figure 1:
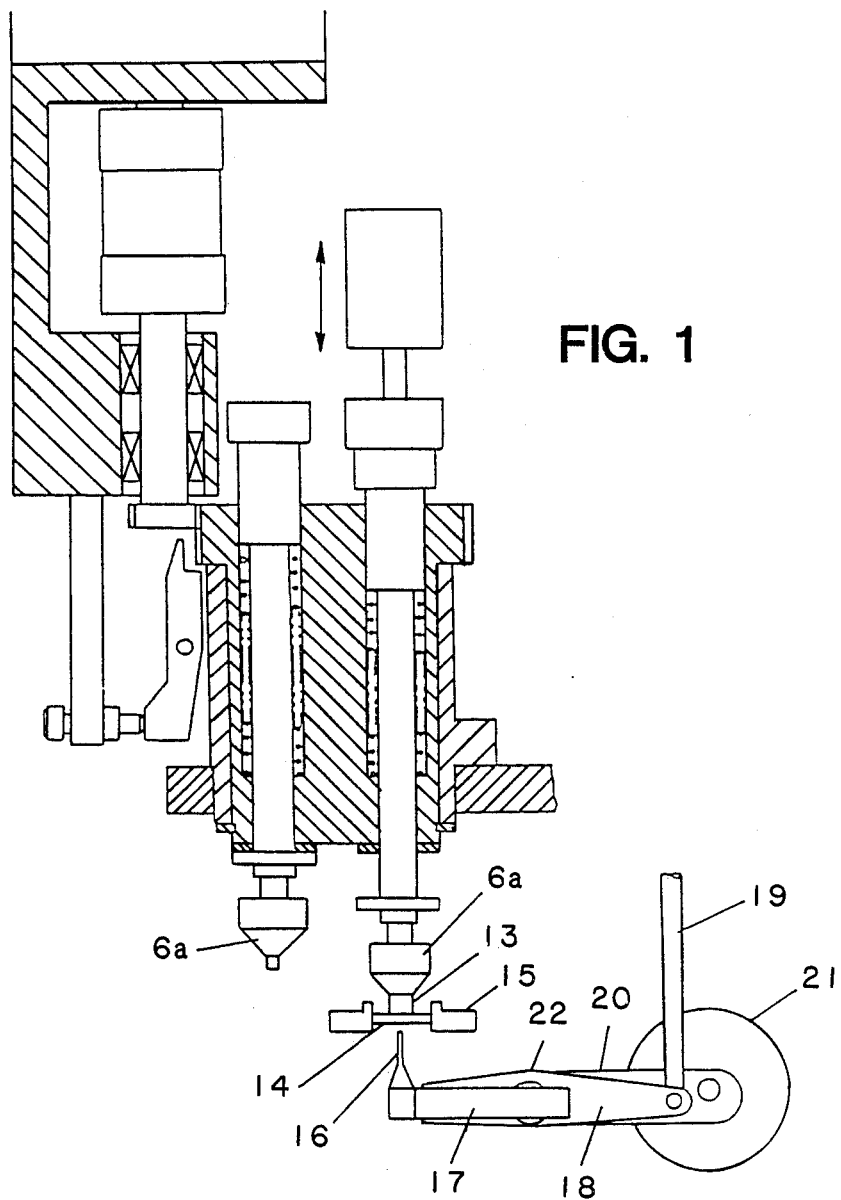
FIG. 1 is a sectional side elevation showing a part of a component-mounting apparatus using a method of this invention, in the vicinity of a stop position C.

FIG. 1 shows a part of the components-mounting apparatus in the vicinity of the stop-position C where the component is centered and adhesive is applied. The reference numeral 13 indicates a tip portion of the nozzle 6a, 14 an electronic component sucked onto the nozzle tip 13, 15 a centering claw of the centering device 7, 16 a dispenser nozzle, 17 a dispenser, 18 a dispenser driving lever, 19 a rod, 20 a fulcrum changing lever, and 21 a pulse motor for adjusting the height of the dispenser nozzle.

The following describes in more detail the operation of the components-mounting apparatus using a method of this invention.

The electronic component delivered by the components-delivery section 5 is sucked at the stop-position A by the nozzle 6a selected at the stop-position G in accordance with the pre-registered component number. The sucked component is transported to the stop-positions B, C and D sequentially by intermittent rotational motion of the rotary head 6. At the stop-position B, a sensor detects the presence or absense of a component sucked onto the nozzle tip 13.

At the stop-position C, the nozzle 6a lowers, and the component 14 sucked onto the nozzle tip 13 is held in position by being gripped from four directions by the centering claws 15, while the dispenser nozzle 16 approaches the component 14 gripped in the centering claws 15 to apply adhesive to the underside of the component. The dispenser 17 supplies an optimum quantity of adhesive by the work of a solenoid valve (not shown) according to the pre-registered component number. Also, the dispenser 17 is fixed to the dispenser driving lever 18 which is driven by a driving mechanism using a cam (not shown) via the rod 19 to accomplish the vertical motion of the dispenser nozzle 16. Furthermore, the shaft of the pulse motor 21 rotates by a given angle according to the pre-registered component number, which causes the fulcrum 22 of the lever 18 to move in the vertical direction via the lever 20, thus adjusting the height of the dispenser nozzle 16 according to the thickness of the component. Upon completion of the adhesive-applying step, the centering claws 15 are opened, and the suction nozzle 6a with the component 14 sucked thereon lifts. Then, the rotary head turns to move the nozzle 6a to the next stop-position D. The centering device is known in the art, and description thereof is omitted.

At the stop-position D, the pulse motor 9 rotates to turn the nozzle 6a so that the component 14 is rotated by a proper angle in accordance with the pre-registered component number. At the stop-position E, the component is mounted on the board 11 held in position by the board feeding device 10.

Thus, as described above, in the component-mounting apparatus using a method of the invention, the nozzle to be used can be selected, an optimum quantity of adhesive can be supplied, and the height of the dispenser nozzle for applying adhesive and the position of the electronic component to be mounted can be adjusted, all in accordance with the pre-registered number of each electronic component, so that various kinds of electronic components can be mounted on the printed circuit board.

If suction trouble of a component is detected at the stop-position B, the above steps from the stop-positions C to E will be skipped to discharge the component at the stop-position F. At the stop-position F also, the nozzle 6a which was rotated at the stop-position D is turned back to its original position.

As described above, in the component-mounting apparatus using a method of this invention, no chucking means is attached to the nozzle, and instead, the centering device is provided separately from the nozzle so as to grip an electronic component in position, so that the component is held in position by the centering device at the time when the rotary head stops at the stop-position where adhesive is applied to the component. Thus, even when the rotary head is operated at high speed, the component can be in position at the time when adhesive is applied thereto, so that there is no possibility that adhesive is applied to the claws of the centering device. This makes it possible to properly mount electronic components on the printed circuit board at high speed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of mounting electronic components, comprising steps of:
   sucking an electronic component by a suction nozzle provided at the tip of a mounting head;
   holding the sucked electronic component in position by a centering device having an opening and closing mechanism and provided separately from the mounting head, and while held by the centering device applying adhesive to a side of the electronic component opposite to that side sucked onto the suction nozzle; and
   mounting the electronic component to a designated position on a printed circuit board.

2. A method of mounting electronic components as set forth in claim 1, wherein said suction nozzle is brought close to said printed circuit board to mount said electronic component to a designated position on said printed circuit board.

3. A method of mounting electronic components as set forth in claim 1, wherein a dispenser is brought close to the underside of said electronic component chucked in said centering device to apply adhesive to the electronic component.

4. A method of mounting electronic components as set forth in claim 3, wherein the position of said dispenser for applying adhesive is changed according to the size of each electronic component.

5. A method of mounting electronic components as set forth in claim 1, wherein said mounting head is provided with a plurality of suction nozzles of different sizes.

6. A method of mounting electronic components as set forth in claim 1, wherein centering claws of said centering device are opened to release the electronic component after application of adhesive to said electronic component.

7. A method of mounting electronic components, comprising steps of:
   sucking an electronic component by one of a plurality of suction nozzles of different sizes provided at the tip of a mounting head;
   holding said sucked electronic component in position by a centering device having an opening and closing mechanism and provided separately from said mounting head, and while holding said component by said centering device applying adhesive to the underside of said electronic component by bringing a dispenser close thereto, the underside being opposite to the side sucked onto said suction nozzles;
   releasing said electronic component from said centering device; and
   mounting said electronic component to a designated position on a printed circuit board.

* * * * *